(12) United States Patent
Chan (10) Patent No.: US 9,620,518 B2
(45) Date of Patent: Apr. 11, 2017

(54) SEMICONDUCTOR DEVICE AND METHOD OF FABRICATING THE SAME

(71) Applicant: MACRONIX International Co., Ltd., Hsinchu (TW)

(72) Inventor: Yao-Fu Chan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/681,980

(22) Filed: Apr. 8, 2015

(65) Prior Publication Data

US 2016/0300849 A1  Oct. 13, 2016

(51) Int. Cl.
 H01L 21/336   (2006.01)
 H01L 27/11582  (2017.01)
 H01L 21/28    (2006.01)
 H01L 29/792   (2006.01)
 H01L 29/10    (2006.01)

(52) U.S. Cl.
 CPC .. H01L 27/11582 (2013.01); H01L 21/28282 (2013.01); H01L 29/1037 (2013.01); H01L 29/7926 (2013.01)

(58) Field of Classification Search
 USPC ....... 257/324, 510, 117, 244, 397, 466, 513, 257/520, 534, 622, E23.131, E21.238, 257/E21.553, E21.558; 438/268
 See application file for complete search history.

(56) References Cited

U.S. PATENT DOCUMENTS 8,053,897 B2 * 11/2011 Lerner ................. H01L 21/743
257/350

FOREIGN PATENT DOCUMENTS

TW   200527510   8/2005
TW   200810027   2/2008

OTHER PUBLICATIONS

"Office Action of Taiwan Counterpart Application", issued on Jun. 16, 2016, p. 1-p. 6.

* cited by examiner

Primary Examiner — Timor Karimy
(74) Attorney, Agent, or Firm — J.C. Patents (57) ABSTRACT

A method of fabricating a semiconductor device is provided. A stack layer is formed on a substrate. The stack layer is patterned to form a plurality of stack structures extending in a first direction. A trench extending in the first direction is located between two adjacent stack structures. Each trench has a plurality of wide portions and a plurality of narrow portions. A maximum width of the wide portions in a second direction is larger than a maximum width of the narrow portions in the second direction. A charge storage layer is formed to cover a bottom surface and sidewalls of the wide portion and fill up the narrow portion. A conductive layer is formed to fill up the wide portion. A semiconductor device formed by the method is also provided.

9 Claims, 7 Drawing Sheets

SEMICONDUCTOR DEVICE AND METHOD OF FABRICATING THE SAME

BACKGROUND OF THE INVENTION

Field of the Invention

The invention relates to a semiconductor device and a method of fabricating the same.

Description of Related Art

With the integration of semiconductor devices, in order to achieve high density and high performance, fabrication of semiconductor devices has evolved into stacking upward in the vertical direction, such that the wafer area can be used more efficiently. Therefore, semiconductor structures with a high aspect ratio are common in small-sized devices.

When fabricating the semiconductor structures with a high aspect ratio, usually etching processes are carried out several times to form material layers having different patterns. However, as the device size decreases, it becomes difficult to perform alignment and control the etching processes, or the patterns may deform after the etching, which may result in collapse of the structure and affect the yield rate of fabrication of the semiconductor devices. Hence, how to reduce the number of times of the etching processes, and prevent pattern deformation after the etching or collapse of the structure is an important issue that needs to be overcome in this field.

SUMMARY OF THE INVENTION

The invention provides a fabricating method of a semiconductor device for reducing the number of times of etching processes and preventing pattern deformation after etching or collapse of the structure.

The fabricating method of the semiconductor device of the invention includes the following. A stack layer is formed on a substrate. The stack layer is patterned to form a plurality of stack structures extending in a first direction. Any two adjacent stack structures have a trench formed therebetween, and the trench extends in the first direction. Each trench has a plurality of wide portions and a plurality of narrow portions, wherein a maximum width of the wide portion in a second direction is larger than a maximum width of the narrow portion in the second direction. A charge storage layer is formed to cover a bottom surface and a sidewall of the wide portion and fill up the narrow portion. A conductive layer is formed to fill up the wide portion.

In an embodiment of the invention, the maximum width of the wide portion in the second direction is 2 to 5 times the maximum width of the narrow portion in the second direction.

In an embodiment of the invention, the maximum width of the narrow portion in the second direction is smaller than or equal to the double of a thickness of the charge storage layer in a third direction.

In an embodiment of the invention, a shape of the wide portions includes circle, ellipse, square, rectangle, rhombus, or a combination thereof.

In an embodiment of the invention, a forming method of the charge storage layer includes thermal oxidation, or chemical vapor deposition.

In an embodiment of the invention, the charge storage layer is a composite layer that includes an oxide layer, a nitride layer, or a combination thereof.

In an embodiment of the invention, a method of pattering the stack layer includes anisotropic etching.

In an embodiment of the invention, the stack layer includes a conductive layer, a dielectric layer, or a combination thereof.

In an embodiment of the invention, the wide portions of each trench and the wide portions of the adjacent trench are arranged alternately, side by side, or in a manner combining the foregoing in the second direction.

The invention further provides a semiconductor device that includes a substrate, stack structures, a charge storage layer, and a conductive layer. The stack structures are disposed on the substrate, wherein any two adjacent stack structures have a trench formed therebetween and the trench extends in a first direction. Each trench includes a plurality of wide portions and a plurality of narrow portions that are alternately arranged. A maximum width of the wide portion in a second direction is larger than a maximum width of the narrow portion in the second direction. The charge storage layer covers a bottom surface and a sidewall of the wide portions and fills up the narrow portions. The conductive layer fills up the wide portions.

In an embodiment of the invention, the maximum width of the wide portion in the second direction is 2 to 5 times the maximum width of the narrow portion in the second direction.

In an embodiment of the invention, the maximum width of the narrow portion in the second direction is smaller than or equal to the double of a thickness of the charge storage layer in a third direction.

In an embodiment of the invention, a shape of the wide portions includes circle, ellipse, square, rectangle, rhombus, or a combination thereof.

In an embodiment of the invention, the charge storage layer includes a dielectric layer.

In an embodiment of the invention, the charge storage layer is a composite layer that includes an oxide layer, a nitride layer, or a combination thereof.

In an embodiment of the invention, a material of the conductive layer includes polysilicon, doped polysilicon, a metal, a metal alloy, or a combination thereof.

In an embodiment of the invention, the stack structure includes a conductive layer, a dielectric layer, or a combination thereof.

In an embodiment of the invention, the stack structures respectively serve as a bit line while the conductive layer serves as a word line.

In an embodiment of the invention, the stack structures respectively serve as the word line while the conductive layer serves as the bit line.

In an embodiment of the invention, the wide portions of each trench and the narrow portions of the adjacent trench are arranged alternately, side by side, or in a manner combining the foregoing in the second direction.

Based on the above, the invention includes forming the trench that has the wide portions and the narrow portions having different widths, such that in the subsequent process of disposing the charge storage layer in the trench, the charge storage layer simultaneously formed in the narrow portion as the charge storage layer is formed in the wide portion can directly serve as the insulating layer. Thus, there is no need to perform an additional process to form the insulating layer. Thereby, the number of the processes of the fabricating method is reduced to prevent pattern deformation after the etching or collapse of the structure.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1E are schematic top views illustrating a fabricating method of a semiconductor device according to an embodiment of the invention. FIG. 2A to FIG. 2E are schematic cross-sectional views, taken along the line A-A' of FIG. 1A to FIG. 1E, illustrating the fabricating method of the semiconductor device.

Figure 1A:
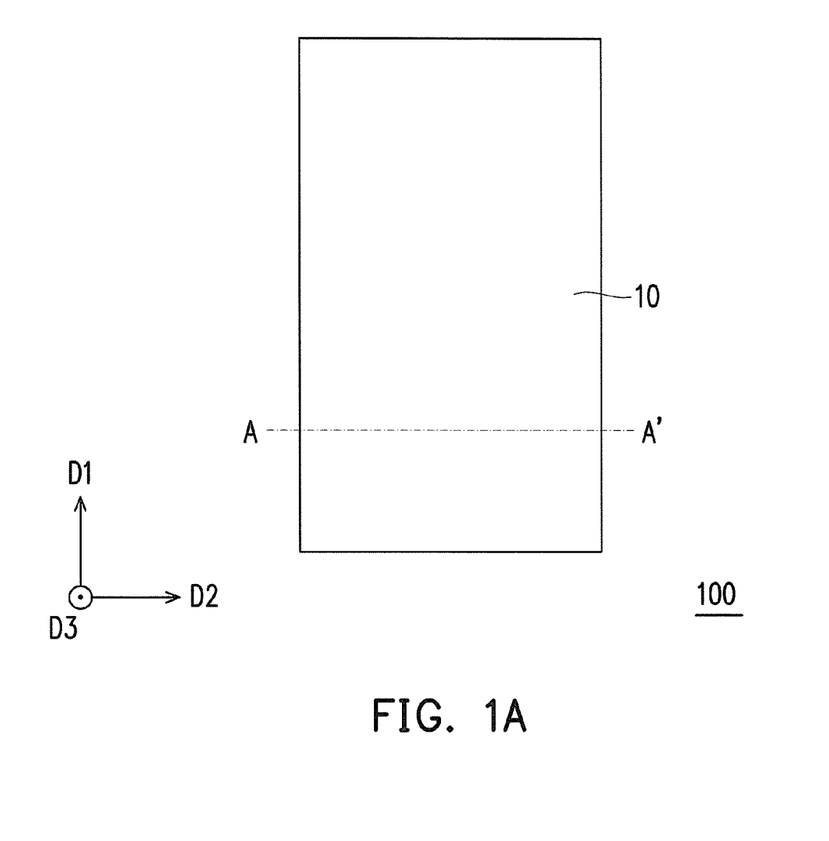
FIG. 1A to FIG. 1E are schematic top views illustrating a fabricating method of a semiconductor device according to an embodiment of the invention.
Figure 2A:
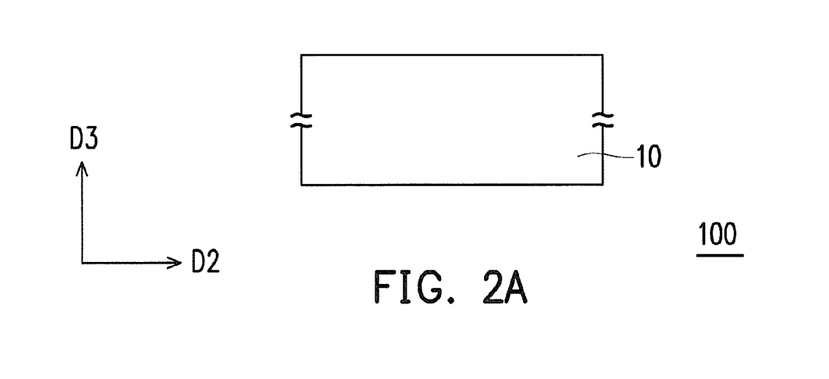
FIG. 2A to FIG. 2E are schematic cross-sectional views, taken along the line A-A' of FIG. 1A to FIG. 1E, illustrating the fabricating method of the semiconductor device.

Referring to FIG. 1A and FIG. 2A, first, a substrate 10 is provided. The substrate 10 may include a semiconductor material, an insulator material, a conductor material, or any combination of the foregoing materials. The material of the substrate 10 is a material composed of at least one selected from a group consisting of Si, Ge, SiGe, GaP, GaAs, SiC, SiGeC, InAs, and InP, or any physical structure suitable for a fabricating process of the invention, for example. The substrate 10 includes a single-layer structure or a multi-layer structure. In addition, a silicon on insulator (SOI) substrate may be used as the substrate 10. The substrate 10 is silicon or silicon germanium, for example.

Figure 1B:
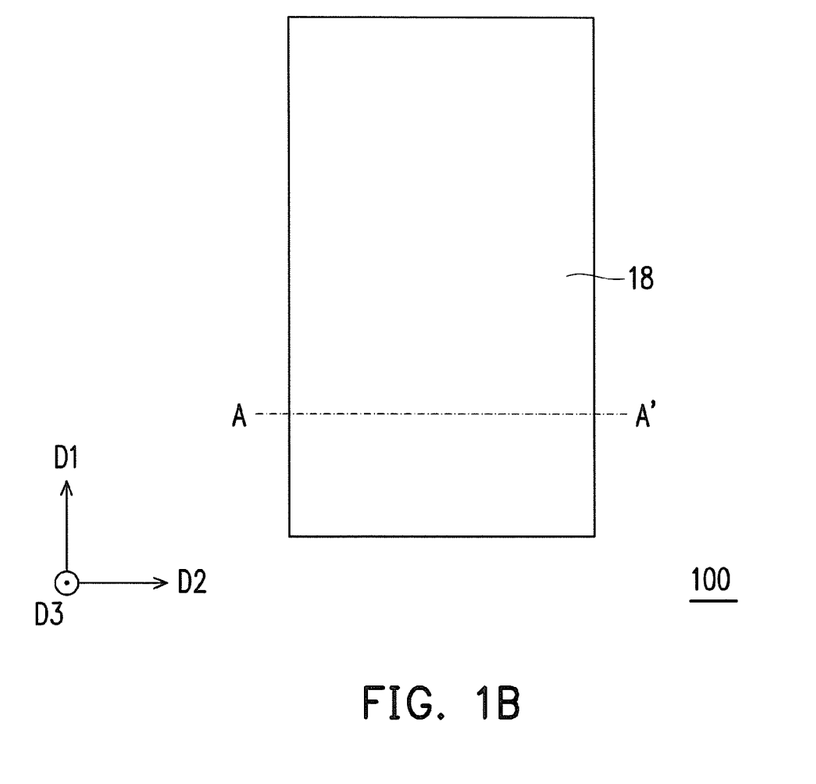
Figure 2B:
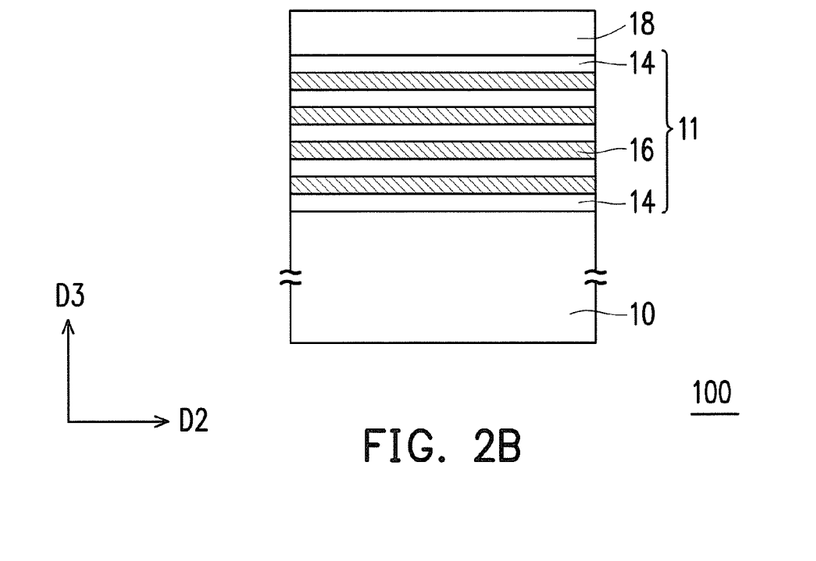

With reference to FIG. 1B and FIG. 2B, a stack layer 11 is formed on the substrate 10. The stack layer 11 includes a plurality of conductive layers 14 and a plurality of dielectric layers 16, for example. The stack layer 11 is formed by alternately stacking the conductive layers 14 and the dielectric layers 16 upward on the substrate 10, for example. In an embodiment, the stack layer 11 includes eight, sixteen, thirty two, or more layers, for example. However, it should be noted that the invention is not limited thereto. A material of the conductive layer 14 includes an undoped semiconductor or a doped semiconductor, such as polysilicon or doped polysilicon. A thickness of the conductive layer 14 is in a range of 200 angstroms to 600 angstroms, for example. A method of forming the conductive layer 14 includes performing chemical vapor deposition. In an embodiment, the conductive layer 14 serves as a bit line or a word line of a semiconductor device 100, for example. A material of the dielectric layer 16 includes an oxide, a nitride, an oxynitride, or a low dielectric constant material having a dielectric constant smaller than 4. A thickness of the dielectric layer 16 is in a range of 200 angstroms to 600 angstroms, for example. A method of forming the dielectric layer 16 includes performing thermal oxidation, or chemical vapor deposition, for example.

Further, referring to FIG. 1B and FIG. 2B again, the stack layer 11 may selectively include a hard mask layer 18. The hard mask layer 18 is located in an uppermost layer of the stack layer 11, for example. However, the invention is not limited thereto. The hard mask layer 18 may be a single layer or include multiple layers. A material of the hard mask layer 18 includes a silicon oxide, a silicon nitride, or other suitable materials, for example. A method of forming the hard mask layer 18 includes performing chemical vapor deposition or metal organic chemical vapor deposition (MOCVD).

Figure 1C:
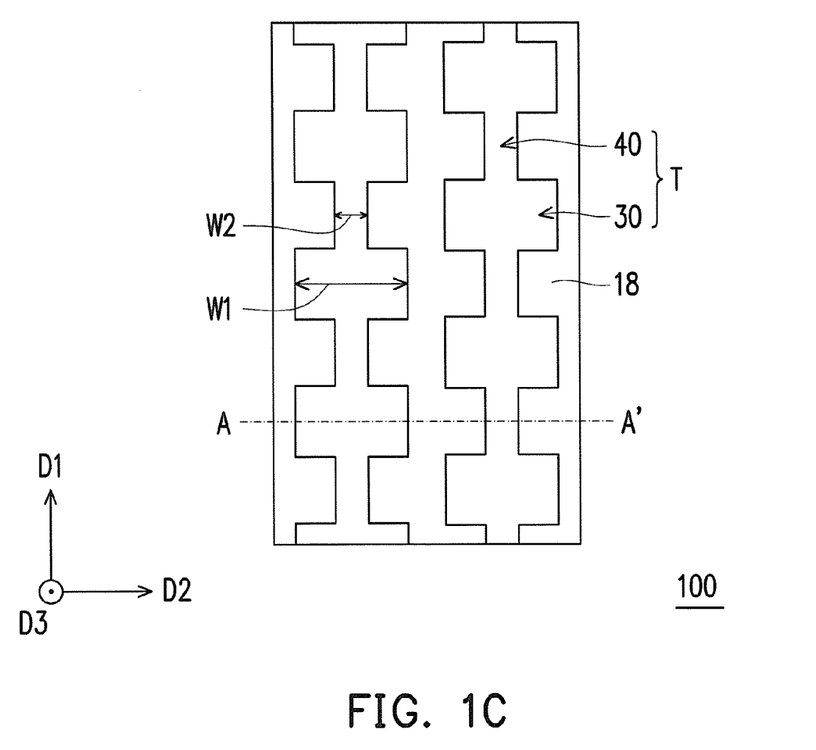
Figure 1D:
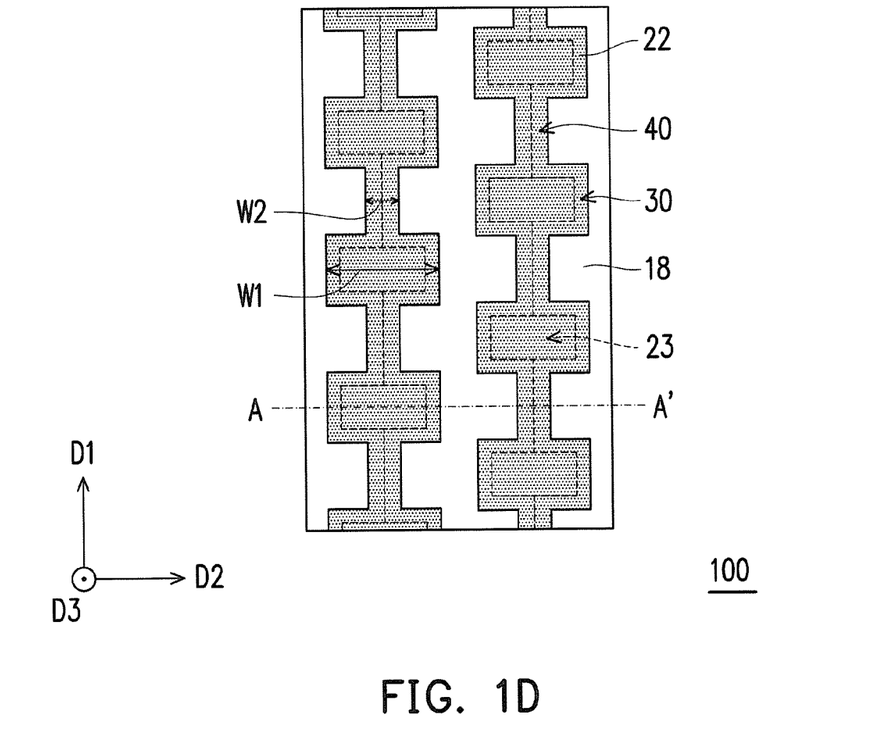
Figure 1E:
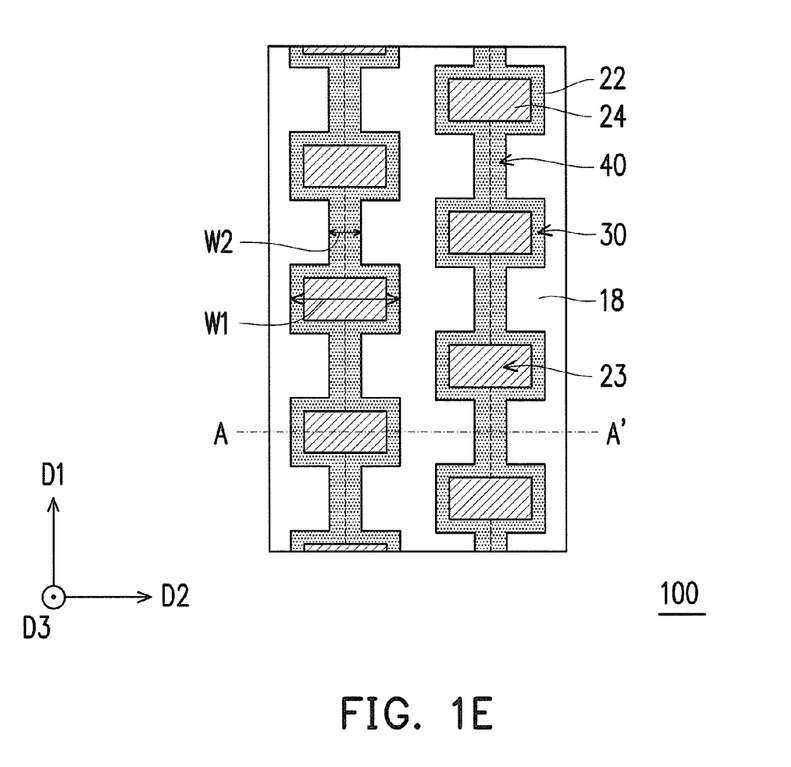
Figure 2C:
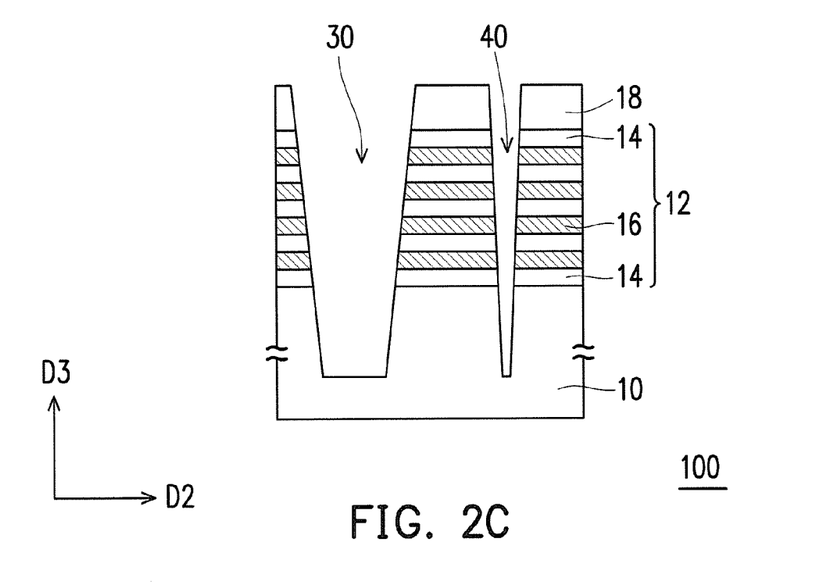

With reference to FIG. 1C and FIG. 2C, the stack layer 11 is patterned to form a plurality of stack structures 12 extending in a first direction D1. A method of patterning the stack layer 11 includes performing lithography and etching processes, for example. The etching process includes dry etching, for example. The dry etching may be sputter etching, reactive ion etching, etc. A trench T extending in the first direction D1 is formed between any two adjacent stack structures 12. Each trench T has a plurality of wide portions 30 and a plurality of narrow portions 40 that are alternately arranged. In a plane viewed from top of the semiconductor device 100 (a plane of the first direction D1 and a second direction D2), a shape of the wide portion 30 may be rectangular (FIG. 1E), circular (FIG. 3), elliptical (FIG. 4, the long axis is in the first direction D1; FIG. 5, the long axis is in the second direction D2), square, rhombic, or a combination of the foregoing; and a shape of the narrow portion 40 may be rectangular (FIG. 1E, FIG. 3 to FIG. 4), square, bottle-shaped, or a combination of the foregoing. Nevertheless, the invention is not limited thereto. In a plane of the second direction D2 and a third direction D3, cross sections of the wide portion 30 and the narrow portion 40 may be in any shape, such as V-shaped, U-shaped, rhombic, or a combination of the foregoing.

A maximum width w1 of the wide portion 30 in the second direction D2 is larger than a maximum width w2 of the narrow portion 40 in the second direction D2. In an embodiment, the maximum width w1 of the wide portion 30 in the second direction D2 is 2 to 5 times the maximum width w2 of the narrow portion 40 in the second direction D2. In another embodiment, the maximum width w2 of the narrow portion 40 in the second direction D2 is smaller than or equal to the double of a thickness t1 of a charge storage layer 22 (to be formed later) in the third direction D3 (see FIG. 2D as described below). The first direction D1 is different from the second direction D2. The third direction D3 is different from the first direction D1 and different from the second direction D2. For example, the first direction D1 is substantially perpendicular to the second direction D2, the first direction D1 is substantially perpendicular to the third direction D3, and the second direction D2 is substantially perpendicular to the third direction D3.

In an embodiment, the maximum width w1 of the wide portion 30 in the second direction D2 is in a range of 300 angstroms to 1500 angstroms, for example. The maximum width w2 of the narrow portion 40 in the second direction D2 is in a range of 150 angstroms to 450 angstroms, for example.

Figure 3:
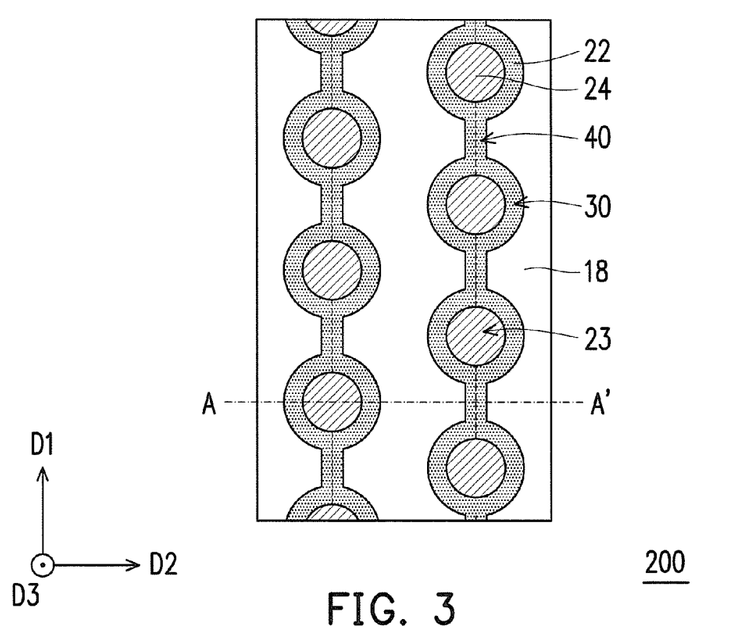
FIG. 3, FIG. 4, and FIG. 5 are schematic top views respectively illustrating the semiconductor device according to several embodiments of the invention.
Figure 4:
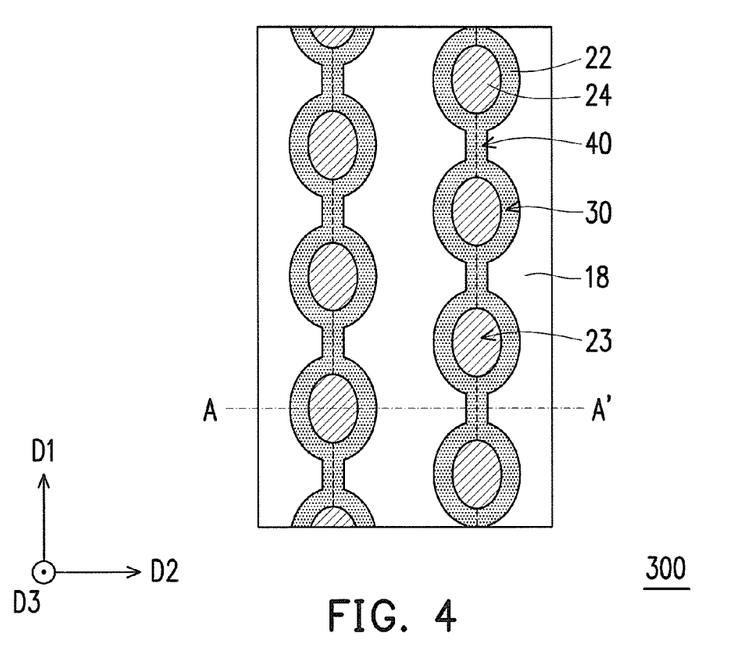
Figure 5:
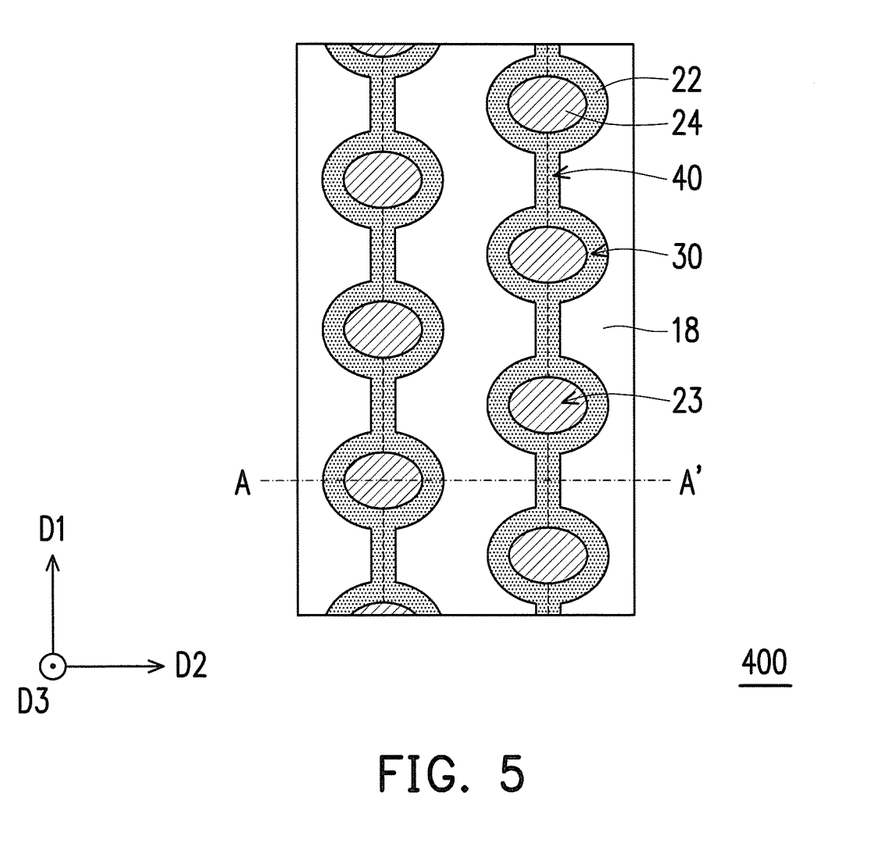

With reference to FIG. 1E, FIG. 3, and FIG. 4, the wide portions 30 of each trench T and the wide portions 30 of the adjacent trench T are arranged alternately in the second direction D2. However, the invention is not limited thereto. In another embodiment, the wide portions 30 of each trench T and the wide portions 30 of the adjacent trench T are arranged side by side in the second direction D2.

Figure 2D:
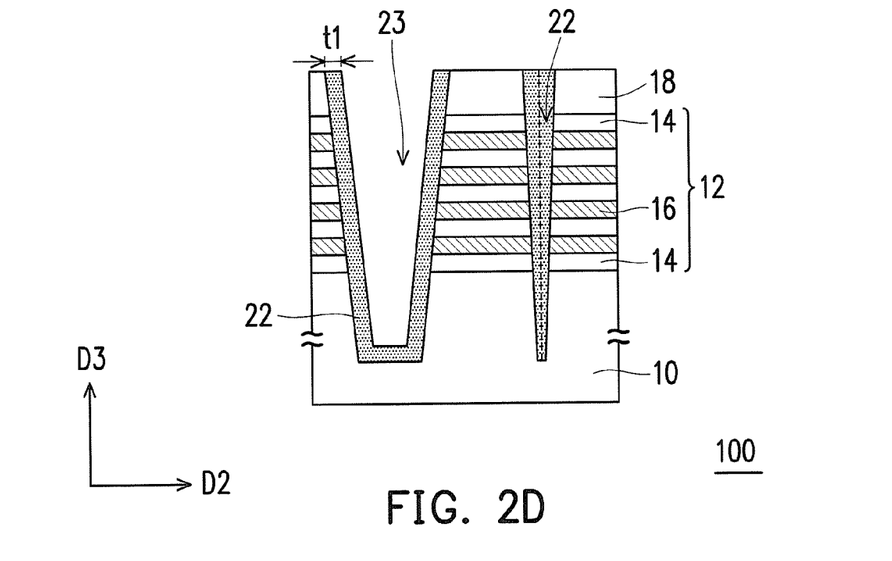

With reference to FIG. 1D and FIG. 2D, the charge storage layer 22 is formed in the trench T. Specifically, the charge storage layer 22 located in the wide portion 30 of the trench T only covers a bottom surface and a sidewall of the wide portion 30 and does not fill up the wide portion 30; and the charge storage layer 22 located in the narrow portion 40 of the trench T fills up the narrow portion 40. In other words, after disposing the charge storage layer 22 in the trench T, a groove 23 exists in the wide portion 30 of the trench T for filling a conductive layer in the subsequent process to serve as a word line or a bit line. On the other hand, the narrow portion 40 of the trench T has been filled up with the charge storage layer 22 and can no longer be filled with the conductive layer. The charge storage layer 22 is a dielectric layer, for example. The charge storage layer 22 may be a composite layer. For example, the charge storage layer 22 is a composite layer including an oxide layer, a nitride layer, or a combination of the foregoing. Specifically, a material of the charge storage layer 22 includes a silicon nitride, a silicon oxide, or a combination of the foregoing. In an embodiment, the charge storage layer 22 is a composite layer of oxide/nitride/oxide (ONO), for example. The thickness t1 of the charge storage layer 22 in the third direction D3 needs to be equal to or larger than one half of the maximum width w2 of the narrow portion 40 in the second direction D2, so as to ensure that the charge storage layer 22 fills up the narrow portion 40. The thickness t1 of the charge storage layer 22 in the third direction D3 is in a range of 100 angstroms to 250 angstroms, for example. However, it should be noted that the invention is not limited thereto. A method of forming the charge storage layer 22 includes performing thermal oxidation, or chemical vapor deposition, for example.

Referring to FIG. 1D, FIG. 1E, FIG. 2D, and FIG. 2E, a conductive layer 24 is formed to fill up the wide portion 30. Specifically, the conductive layer 24 fills up the groove 23. A material of the conductive layer 24 includes polysilicon, doped polysilicon, metal, metal alloy, or a combination of the foregoing, for example. The metal is tungsten, for example. The metal alloy is aluminum silicon alloy, for example. A method of forming the conductive layer 24 includes performing chemical vapor deposition. In an embodiment, a barrier layer may be formed on the sidewall and the bottom surface of the wide portion 30 before formation of the conductive layer 24. A material of the barrier layer includes titanium, titanium nitride, tantalum, tantalum nitride, or a combination of the foregoing, for example. A thickness of the barrier layer is in a range of 10 angstroms to 200 angstroms, for example. A method of forming the barrier layer includes performing chemical vapor deposition, for example. The conductive layer 24 serves as a word line or a bit line of a memory device, for example. In an embodiment, the conductive layer 24 serves as the word line (e.g., channel structure) of the memory device; and the conductive layer 14 in the stack structure 12 serves as the bit line (e.g., gate structure) of the memory device. In another embodiment, the conductive layer 24 serves as the bit line of the memory device; and the conductive layer 14 in the stack structure 12 serves as the word line of the memory device. Nevertheless, the invention is not limited thereto.

In this embodiment, the maximum width w2 of the narrow portion 40 of the trench T is set to be smaller than or equal to the double of the thickness t1 of the charge storage layer 22 formed in the subsequent process, such that the charge storage layer 22 fills up the narrow portion 40, and the groove 23 is formed for disposing the conductive layer 24 in the wide portion 30 since the wide portion 30 is not filled up with the charge storage layer 22. Therefore, the charge storage layer 22 in the narrow portion 40 directly serves as an insulating layer to electrically isolate adjacent two conductive layers 24 in the first direction D1. Hence, there is no need to perform an additional process for forming the insulating layer afterward. That is, by performing one process to form the charge storage layer 22, the charge storage layer 22 is formed in the wide portion 30 simultaneously while the insulating layer is formed in the narrow portion 40.

In addition, by forming the wide portions 30 and the narrow portions 40 alternately in each trench T, and arranging the wide portions 30 of each trench T and the wide portions 30 of the adjacent trench T alternately, side by side, or in a manner combining the foregoing in the second direction D2, the stack structure of this embodiment is less likely to collapse compared with a conventional stack structure that does not have the wide and narrow portions. More specifically, in the conventional stack structure that does not have the wide portions and the narrow portions; the distance between the stack structures in adjacent two trenches is equal to the distance between the wide portions of the present embodiment. According to the embodiment of the invention, the distance between the stack structures in adjacent two trenches is increased by arranging the wide portions and the narrow portions in the aforementioned manner, thereby reducing the probability of collapse of the semiconductor structure.

Figure 2E:
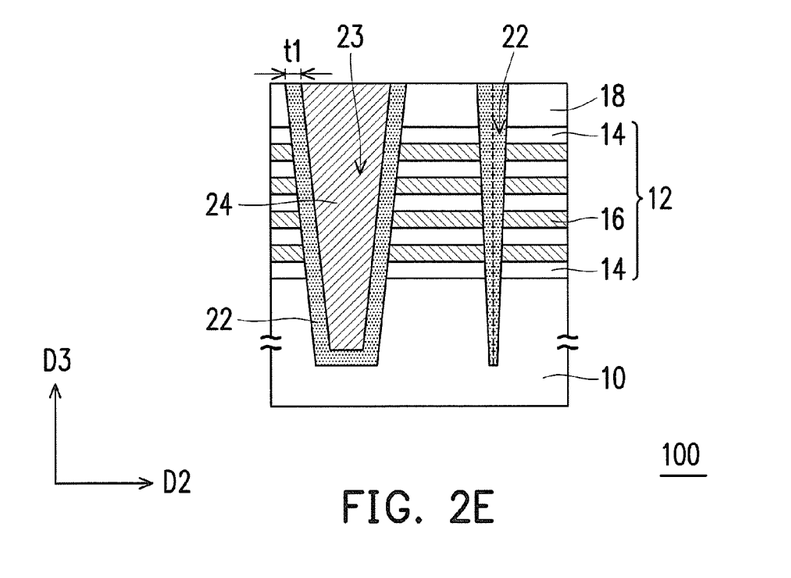

With reference to FIG. 1E and FIG. 2E, the semiconductor device 100 of the embodiment of the invention includes the substrate 10, the stack structures 12, the charge storage layer 22, and the conductive layer 24. The stack structures 12 are disposed on the substrate 10 and have the trench T formed therebetween. The trench T extends in the first direction D1 and has a plurality of wide portions 30 and a plurality of narrow portions 40 that are alternately arranged. The charge storage layer 22 is disposed in the trench T. The charge storage layer 22 in the wide portion 30 of the trench T only covers the bottom surface and the sidewall of the wide portion 30 and does not fill up the wide portion 30, leaving the groove 23; and the charge storage layer 22 in the narrow portion 40 of the trench T fills up the narrow portion 40. The conductive layer 24 fills up the groove 23. The material and forming method of the conductive layer 24 have been specified above. Thus, details thereof are not repeated hereinafter.

In the semiconductor device 100 of the invention, the material of the insulating layer is the same as the material of the charge storage layer 22. More specifically, the charge storage layer 22 in the narrow portion 40 may serve as the insulating layer of the semiconductor device 100 of the invention, and the charge storage layer 22 in the wide portion 30 may serve as the charge storage layer afterward. In an embodiment, when the maximum width w2 of the narrow portion 40 in the second direction D2 is smaller than the double of the thickness t1 of the charge storage layer 22 in the third direction D3, the number of layers of the charge storage layer 22 in the narrow portion 40 may differ from the number of layers of the charge storage layer 22 in the wide portion 30.

With reference to FIG. 1E, FIG. 3, and FIG. 4, the shape of the wide portion 30 is square in the above embodiment (FIG. 1E). Other embodiments may be different from the above embodiment in that the shape of the wide portion 30 is circular (FIG. 3) or elliptical (FIG. 4 and FIG. 5). As to the structure, material, thickness, and forming method, details have been specified above and therefore are not repeated hereinafter.

The fabricating method of the semiconductor device described in the embodiments is suitable for DRAM, NAND flash, NOR-flash, etc., but the invention is not limited to the foregoing.

To conclude the above, in the embodiments of the invention, the trench for isolating the stack structures is formed with the wide portions and narrow portions that have different widths. Therefore, the charge storage layer formed in the subsequent process fills up the narrow portions of the trench to directly serve as the insulating layer. Since there is no need to perform other processes afterward to form the insulating layer, the number of times of etching processes is reduced to prevent pattern deformation after the etching or collapse of the structure, and thereby electrical performance and yield rate of the semiconductor device are improved.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A fabricating method of a semiconductor device, the fabricating method comprising:
    forming a stack layer on a substrate;
    patterning the stack layer to form a plurality of stack structures extending in a first direction, wherein any two adjacent stack structures have a trench formed therebetween and the trench extends in the first direction, and the trench comprises a plurality of wide portions and a plurality of narrow portions that are alternately arranged in the first direction, wherein a maximum width of the wide portion in a second direction is larger than a maximum width of the narrow portion in the second direction;
    forming a charge storage layer to cover a bottom surface and a sidewall of the wide portions and fill up the narrow portions; and
    forming a conductive layer to fill up the wide portions.

2. The fabricating method according to claim 1, wherein the maximum width of the wide portion in the second direction is 2 to 5 times the maximum width of the narrow portion in the second direction.

3. The fabricating method according to claim 1, wherein the maximum width of the narrow portion in the second direction is smaller than or equal to the double of a thickness of the charge storage layer in a third direction.

4. The fabricating method according to claim 1, wherein a shape of the wide portions comprises circle, ellipse, square, rectangle, rhombus, or a combination thereof.

5. The fabricating method according to claim 1, wherein a forming method of the charge storage layer comprises thermal oxidation, or chemical vapor deposition.

6. The fabricating method according to claim 1, wherein the charge storage layer is a composite layer that comprises an oxide layer, a nitride layer, or a combination thereof.

7. The fabricating method according to claim 1, wherein a method of patterning the stack layer comprises anisotropic etching.

8. The fabricating method according to claim 1, wherein the stack layer comprises a conductive layer, a dielectric layer, or a combination thereof.

9. The fabricating method according to claim 1, wherein the wide portions of each trench and the wide portions of the adjacent trench are arranged alternately, side by side, or in a manner combining the foregoing in the second direction.

* * * * *